US011218817B1

(12) United States Patent
Ganot et al.

(10) Patent No.: US 11,218,817 B1
(45) Date of Patent: Jan. 4, 2022

(54) SYSTEM AND METHOD FOR PERSONALIZED HEARING AID ADJUSTMENT

(71) Applicant: AUDIOCARE TECHNOLOGIES LTD., Gan Yoshiya (IL)

(72) Inventors: Ron Ganot, Kfar Saba (IL); Omri Gavish, Gan Yoshiya (IL)

(73) Assignee: AUDIOCARE TECHNOLOGIES LTD., Gan Yoshiya (IL)

( * ) Notice: Subject to any disclaimer, the term of this patent is extended or adjusted under 35 U.S.C. 154(b) by 0 days.

(21) Appl. No.: 17/390,995

(22) Filed: Aug. 1, 2021

(51) Int. Cl.
*H03G 3/00* (2006.01)
*H04R 25/00* (2006.01)

(52) U.S. Cl.
CPC ......... *H04R 25/558* (2013.01); *H04R 25/505* (2013.01); *H04R 2225/55* (2013.01)

(58) Field of Classification Search
CPC .... H04R 1/1016; H04R 1/105; H04R 1/1091; H04R 5/033; H04R 25/70; H04R 25/45; H04R 25/453; H04R 25/505; H04R 2225/43; H04R 2225/67
See application file for complete search history.

(56) References Cited

U.S. PATENT DOCUMENTS

| | | | |
|---|---|---|---|
| 9,532,152 B2 | 12/2016 | Shennib | |
| 10,757,513 B1 | 8/2020 | Chen et al. | |
| 2011/0044473 A1* | 2/2011 | Shon ...................... | H03G 5/165 381/104 |
| 2013/0178162 A1 | 7/2013 | Neumeyer et al. | |
| 2013/0243227 A1 | 9/2013 | Kinsbergen et al. | |
| 2014/0169574 A1 | 6/2014 | Choi et al. | |
| 2014/0211973 A1 | 7/2014 | Wang et al. | |
| 2014/0309549 A1 | 10/2014 | Selig et al. | |
| 2015/0271607 A1 | 9/2015 | Sabin | |
| 2016/0309267 A1 | 10/2016 | Fitz et al. | |
| 2017/0201839 A1 | 7/2017 | Manchester | |
| 2017/0230762 A1 | 8/2017 | Simonides et al. | |
| 2018/0108370 A1 | 4/2018 | Dow et al. | |
| 2018/0115841 A1 | 4/2018 | Apfel et al. | |
| 2018/0213339 A1 | 7/2018 | Shah et al. | |
| 2018/0227682 A1 | 8/2018 | Lederman | |
| 2019/0082274 A1 | 3/2019 | Dickmann et al. | |

(Continued)

FOREIGN PATENT DOCUMENTS

| | | |
|---|---|---|
| CN | 109151692 | 1/2019 |
| EP | 31614695 | 2/2020 |

*Primary Examiner* — Amir H Etesam
(74) *Attorney, Agent, or Firm* — The Roy Gross Law Firm, LLC; Roy Gross

(57) ABSTRACT

According to some embodiments, there is provided a method for personalized hearing aid adjustment, the method including receiving a user-initiated input regarding a perceived deficiency in the user's hearing experience, providing to the user, using a detection algorithm, a suggestion regarding an issue potentially related to the perceived deficiency in the user's hearing experience, receiving from the user a second user input regarding the relevancy of the suggested issue; wherein when the second user input is indicative of the suggested issue being relevant to the perceived deficiency in the user's hearing experience, providing a suggested solution to the perceived deficiency utilizing a solution algorithm, wherein the suggested solution comprises adjusting one or more parameters of the hearing aid.

25 Claims, 11 Drawing Sheets

(56) References Cited

U.S. PATENT DOCUMENTS

| | | | |
|---|---|---|---|
| 2019/0166435 | A1 | 5/2019 | Crow et al. |
| 2019/0182606 | A1 | 6/2019 | Peterson et al. |
| 2019/0356989 | A1 | 11/2019 | Li et al. |
| 2020/0322742 | A1 | 10/2020 | Boretzki et al. |
| 2020/0389743 | A1 | 12/2020 | Li et al. |
| 2020/0404431 | A1 | 12/2020 | Jung et al. |

* cited by examiner

SYSTEM AND METHOD FOR PERSONALIZED HEARING AID ADJUSTMENT

TECHNICAL FIELD OF THE INVENTION

The present disclosure relates generally to the field of personalized adjustment of hearing solutions, in particular personalized adjustment of hearing aids, specifically adjustments executable by a user of the hearing aid, using artificial intelligence.

BACKGROUND OF THE INVENTION

Modern hearing aids are today most often controlled by digital data processors and signal processors.

However, typically programming and adjusting of parameters of the hearing aid requires a user to make an appointment with a hearing professional (typically an audiologist) and to come into an office that has the necessary equipment. This imposes the inconvenience, expense and time consumption associated with travel to a remote location, which is particularly problematic for users with limited mobility, users who live in remote areas, and/or users who live in developing countries where a hearing professional may not be available.

Additionally, the hearing professional's office is normally a relatively quiet environment and background noises from crowds, machines and other audio sources that exist as part of a user's real-life experiences are typically absent.

Automated solutions that claimed to obviate or at least reduce the need for face-to-face visits have been disclosed. Typically, these solutions are based on machine learning algorithms that are applied on data obtained from a plurality of users and are automatically applied, for example, in response to changes in the acoustic environment of the user sensed by a microphone positioned on the hearing aid.

The problem with these automated solutions is that they override the user's perceived hearing experience, which often varies from user to user, even when in a same acoustic environment.

Other solutions are directed to remote sessions with a hearing professional, i.e. a hearing-aid professional can remotely access a user's hearing aid and set or change its operational parameters. However, these 'remote access type' solutions still require the availability of the hearing professional and may therefore not be accessible at the time that they are actually required, to the frustration of the user.

There therefore remains a need for systems and methods that enable a user to autonomously adjust parameters of his/her hearing aid, as per his/her own hearing experience and at a time of his/her need.

SUMMARY OF THE INVENTION

Aspects of the disclosure, according to some embodiments thereof, relate to systems, platforms and methods that enable a user to autonomously adjust parameters of his/her hearing aid so as to accommodate his/her perceived hearing experience and at a time of need of his/her convenience.

Advantageously the adjustment is done by applying artificial intelligence (AI) algorithms that incorporate expert knowledge as well as subject related parameters, such as, but not limited to, the profile of the user (e.g. age, gender, medical history and the like), the user's audiogram (as obtained from a hearing test), current hearing aid parameter values, previous adjustments made to the hearing aid parameters, changes previously made by the user in a same acoustic environment, trends in changes of hearing aid parameters (e.g. due to a decrease in the subject's hearing ability), the user's acoustic fingerprint (e.g. preferences, specific disliked sounds etc.) and any combination thereof.

Advantageously, the adjustment may be made "on the fly" i.e. immediately in response to a user's request.

As a further advantage, the AI algorithm may include an individualized machine learning module configured for "learning" the specific user's preferences and needs, based on previous changes, and their successful/unsuccessful implementation.

According to some embodiments, there is provided a method for personalized hearing aid adjustment, the method including: receiving a user-initiated input regarding a perceived deficiency in the user's hearing experience, the deficiency related to the hearing aid, providing to the user, using a detection algorithm, a suggestion regarding an issue potentially related to the perceived deficiency in the user's hearing experience, receiving from the user a second user input regarding the relevancy of the suggested issue; wherein when the second user input is indicative of the suggested issue being irrelevant to the perceived deficiency in the user's hearing experience, a revised suggested issue is provided using the detection algorithm, and wherein when the second user input is indicative of the suggested issue being relevant to the perceived deficiency in the user's hearing experience, provide a suggested solution to the perceived deficiency utilizing a solution algorithm, wherein the suggested solution comprises adjusting one or more parameters of the hearing aid.

According to some embodiments, the deficiency in the user's hearing experience is selected from sound loudness, sound quality, interfering noises, perception of the user's own voice, acoustic feedback, technical problems, or any combination thereof. Each possibility is a separate embodiment.

According to some embodiments, the one or more parameters is selected from increasing gain for a specific channel, decreasing gain for a specific channel, replacing the dome of the hearing aid, adding/changing a hearing program, replacing the battery, and enabling/disabling specific features, or any combination thereof. Each possibility is a separate embodiment.

According to some embodiments, the user-initiated input is a textual description. According to some embodiments, the detection algorithm is configured to derive the issue from the textual description. According to some embodiments, the deriving of the issue from the textual description may include identifying key elements indicative of the issue in the textual description.

According to some embodiments, the solution algorithm is an artificial intelligence algorithm taking into consideration expert knowledge, user profile, the user's audiogram, current hearing aid parameter values, previous adjustments made to the hearing aid parameters, changes previously made by the user in a same environment, trend in changes of hearing aid parameters, the user's acoustic fingerprint and any combination thereof. Each possibility is a separate embodiment.

According to some embodiments, the method further includes requesting authorization from the user to implement the suggested solution. According to some embodiments, the method further includes providing instructions to the user regarding the implementation of the suggested solution.

According to some embodiments, the method further includes requesting the user's follow-up input regarding the perceived efficacy of the suggested solution after its implementation. According to some embodiments, the method further includes updating the solution algorithm, based on the user's follow-up indication.

According to some embodiments, the suggested solution comprises a set of incremental changes to the one or more parameters, the incremental changes configured for being applied gradually after initial implementation of the suggested solution.

According to some embodiments, the method further includes generating one or more sound environment categories, each category comprising a solution previously implemented for the user in association with the sound environments.

According to some embodiments, the method further includes prompting the user to apply a previous implemented solution, when entering a similar sound environment. According to some embodiments, the prompting to apply a previous implemented solution, may be based on a temporal or spatial prediction.

According to some embodiments, there is provided a system for personalized hearing aid adjustment, the system comprising a processing logic configured to: receive a user-initiated input regarding a perceived deficiency in the user's hearing experience, the deficiency related to the hearing aid, apply a detection algorithm on the user-initiated input, the detection algorithm configured to derive an issue potentially related to the perceived deficiency in the user's hearing experience from the user-initiated input, and upon receiving a user confirmation of the issue being relevant to the perceived deficiency in the user's hearing experience, provide a suggested solution to the perceived deficiency utilizing a solution algorithm, wherein the suggested solution comprises a proposed adjustment of one or more parameters of the hearing aid.

According to some embodiments, the processing logic is further configured to provide a revised suggested issue, if the suggested solution is indicated by the user as being irrelevant to the suggested issue.

According to some embodiments, the one or more parameters is selected from increasing gain for a specific channel, decreasing gain for a specific channel, replacing the dome of the hearing aid, adding/changing a hearing program, replacing the battery, and enabling/disabling specific features, or any combination thereof. Each possibility is a separate embodiment.

According to some embodiments, the user-initiated input is a textual description. According to some embodiments, the detection algorithm applied by the processing logic is configured to derive the issue from the textual description.

According to some embodiments, the solution algorithm is an artificial intelligence algorithm taking into consideration expert knowledge, user profile, the user's audiogram, current hearing aid parameter values, previous adjustments made to the hearing aid parameters, changes previously made by the user in a same environment, trend in changes of hearing aid parameters, the user's acoustic fingerprint and any combination thereof. Each possibility is a separate embodiment.

According to some embodiments, the processing logic is further configured to request a follow-up input from the user, the follow-up input indicative of the user's perceived efficacy of the suggested solution after its implementation. According to some embodiments, the processing logic is further configured to update the solution algorithm, based on the user's follow-up indication.

According to some embodiments, the system further includes a hearing aid operationally connected to the processing logic.

According to some embodiments, the processing logic is configured to be executable on a smartphone, an iPAD, a laptop or a personal computer of the user. Each possibility is a separate embodiment.

According to some embodiments, the processing logic is further configured to store a successfully implemented solution. According to some embodiments, the successfully implemented solution is a suggested solution which received a follow-up input from the user indicative of it being efficient in improving the perceived deficiency in the user's hearing experience after having been implemented.

According to some embodiments, the processing logic is further configured to generate one or more sound environment categories. According to some embodiments, the storing comprises storing the suggested solutions in an appropriate category, the appropriate category being associated with a sound environment in which the suggested solution was successfully implemented.

Certain embodiments of the present disclosure may include some, all, or none of the above advantages. One or more other technical advantages may be readily apparent to those skilled in the art from the figures, descriptions, and claims included herein. Moreover, while specific advantages have been enumerated above, various embodiments may include all, some, or none of the enumerated advantages.

Unless otherwise defined, all technical and scientific terms used herein have the same meaning as commonly understood by one of ordinary skill in the art to which this disclosure pertains. In case of conflict, the patent specification, including definitions, governs. As used herein, the indefinite articles "a" and "an" mean "at least one" or "one or more" unless the context clearly dictates otherwise.

BRIEF DESCRIPTION OF THE FIGURES

Some embodiments of the disclosure are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the disclosure. For the sake of clarity, some objects depicted in the figures are not drawn to scale. Moreover, two different objects in the same figure may be drawn to different scales. In particular, the scale of some objects may be greatly exaggerated as compared to other objects in the same figure.

In block diagrams and flowcharts, certain steps may be conducted in the indicated order only, while others may be conducted before a previous step, after a subsequent step or simultaneously with another step. Such changes to the orders of the step will be evident for the skilled artisan. Chat bot conversations are indicated in balloons and user instructions provided through selecting an icon or an option from a scroll down menu is indicated by grey boxes. It is understood that combining both text conversations and buttons is optional, and that the entire conversation tree may be through text messages or even, but generally less preferred, through instruction buttons and/or scroll-down menus.

DETAILED DESCRIPTION OF THE INVENTION

Figure 1:
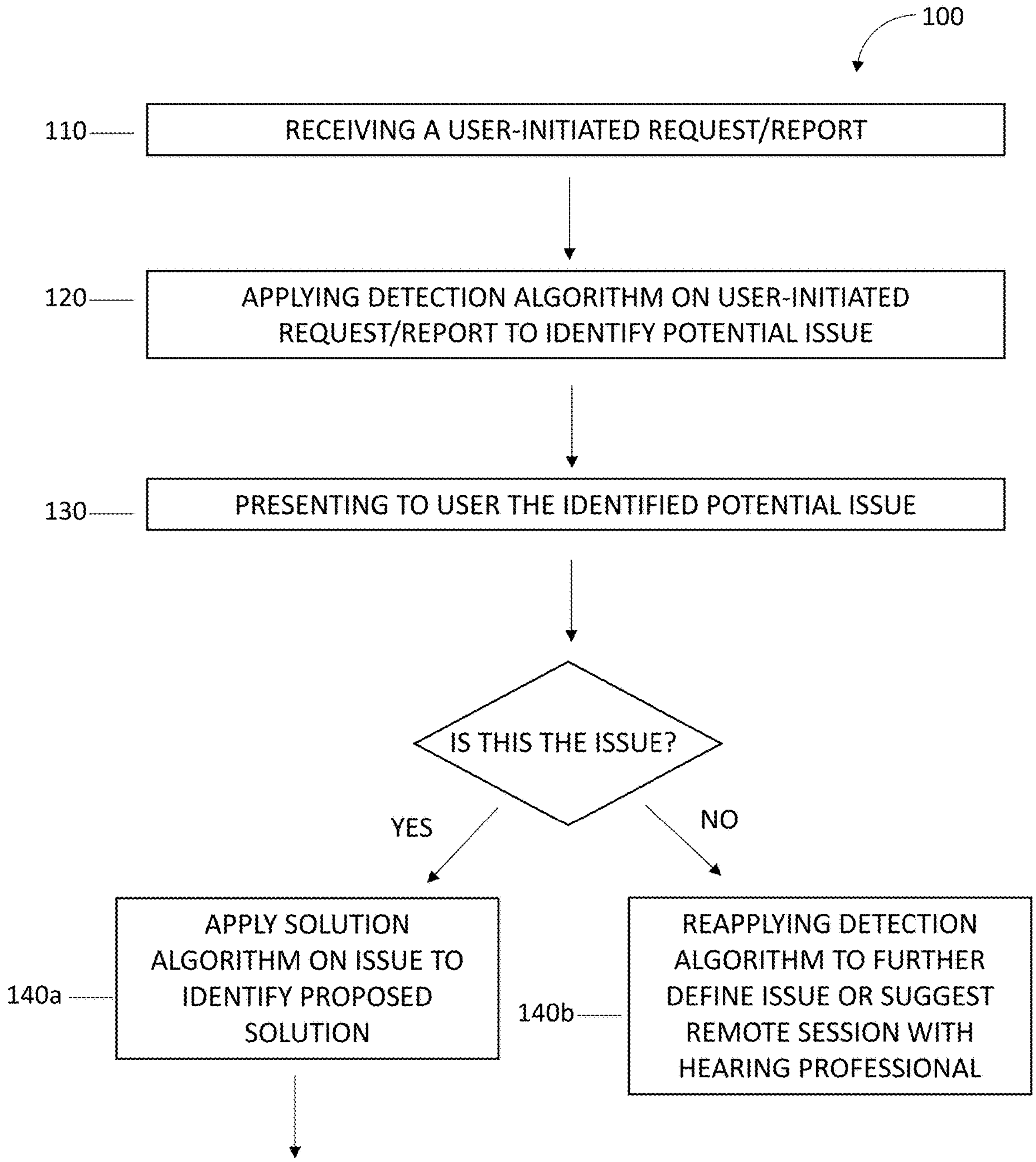
FIG. 1 shows a flowchart of the herein disclosed method for personalized hearing aid adjustment, according to some embodiments.
Figure 1:
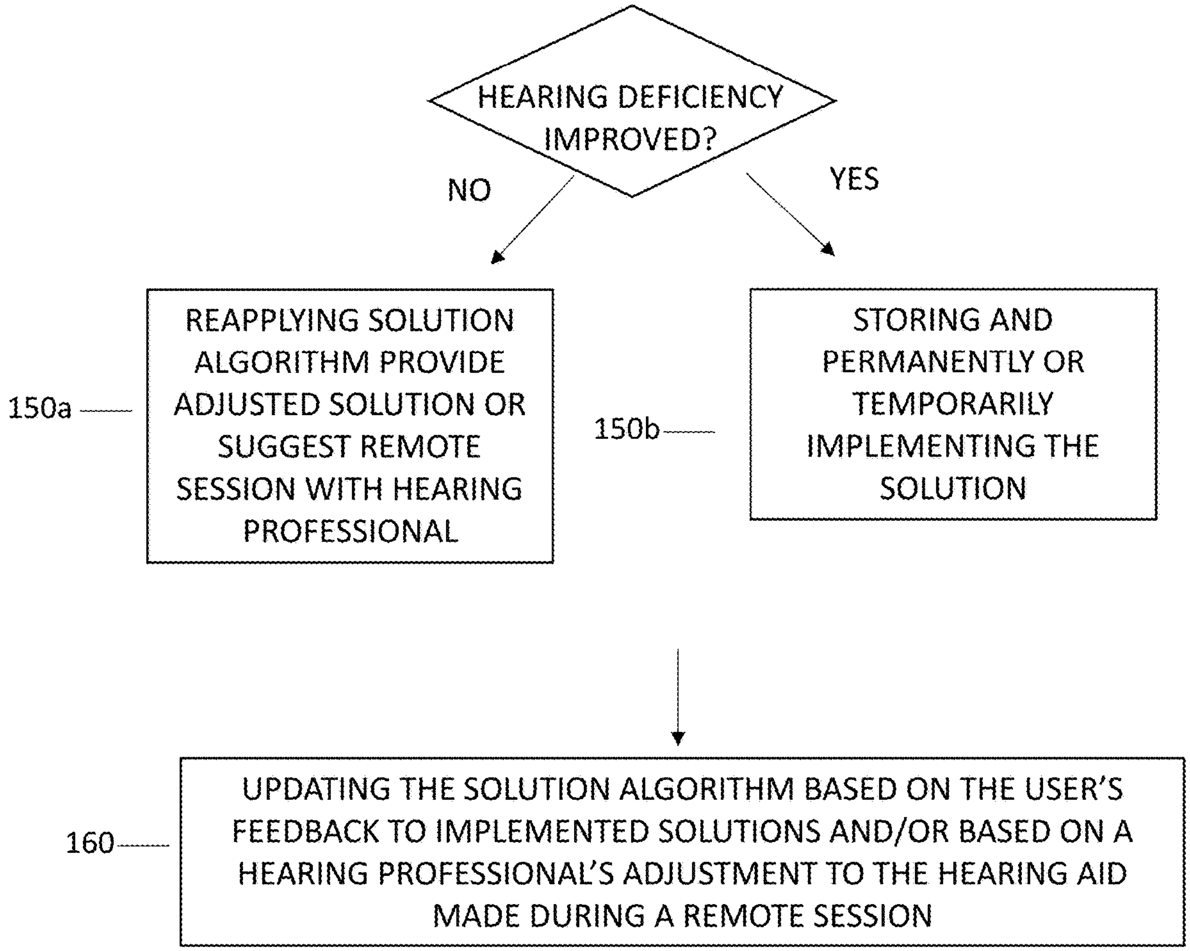

The principles, uses and implementations of the teachings herein may be better understood with reference to the accompanying description and figures. Upon perusal of the description and figures present herein, one skilled in the art will be able to implement the teachings herein without undue effort or experimentation. In the figures, same reference numerals refer to same parts throughout.

According to some embodiments, there is provided a method/platform for personalized hearing aid adjustment, the method/platform including receiving a user-initiated input regarding a perceived deficiency in the user's hearing experience and/or a mechanical problem with the hearing aid, providing to the user, using a detection algorithm, a suggestion regarding an issue potentially related to the perceived deficiency in the user's hearing experience, receiving from the user a second user input regarding the relevancy of the suggested issue; wherein when the second user input is indicative of the suggested issue being relevant to the perceived deficiency in the user's hearing experience, provide a suggested solution to the perceived deficiency utilizing a solution algorithm, wherein the suggested solution comprises adjusting one or more parameters of the hearing aid.

The herein disclosed system, platforms and methods are described in the context of hearing aids. It is however understood that they may likewise be implemented for other hearing solutions, such as earphones, headphones, personal amplifiers, augmented reality buds or any combination thereof. Each possibility is a separate embodiment.

As used herein, the term "personalized" in the context of the herein disclosed system and method/platform for hearing aid adjustment refers to a system and method/platform for hearing aid adjustment, which is configured to meet the hearing aid user's individual requirement, based on his/her perceived hearing experience.

As used herein, the term "perceived deficiency" refers to a deficiency that the subject experiences and reports. It is understood that a perceived deficiency may be different from a measured deficiency. For this reason, the solution to the perceived deficiency may be different from solutions provided by solutions that are based on machine learning algorithms applied on data received from multiple users.

As used herein, the term "adjustment" refers to changes made in operational parameters of the hearing aid, after the initial programming thereof.

As used herein, the term "user-initiated input" refers to an initial request/report made by the user through a user interface (such as an app). A non-limited example of an optional user-initiated input is a message delivered through a chat bot (a software application used to conduct chat conversation via text or text-to-speech). Another example of an optional user-initiated input is a selection made by the user from a scroll-down menu of user requests/reports suggested by the app. The content of the user-initiated input may vary based on the specific hearing associated problem encountered by the user. According to some embodiments, the user-initiated input may be related to the operation/function of the hearing aid. According to some embodiments, the user-initiated input may be related to the hearing experience of the user wearing the hearing aid. For example, the user may experience that certain sounds are too loud/penetrating.

As used herein, the term "detection algorithm" may be any detection logic configured to retrieve an "issue" from a user-initiated input. According to some embodiments, when the user-initiated input is a text message, the detection algorithm may be configured to extract and/or derive the issue by identification of key features/elements in the text message. According to some embodiments, the method/platform applies Natural Language Processing (NLP) to for user query interpretation.

According to some embodiments, the method/platform first detects a user problem and after that looks for a solution, for example, based on a database of professional audiologist knowledge. According to some embodiments, if some key values are missing from the original user query or the query is unclear, the method platform may ask the user additional questions to clarify the user's problem.

According to some embodiments, the detection algorithm may tag, label or otherwise sort elements in the user-initiated input. According to some embodiments, the tagging may include tagging the issue according to sound, environment, duration and sensation (e.g. 'bird sounds', 'outdoors', 'constant', and 'painful' respectively). According to some embodiments, the tagging may include tagging a combination of sound properties ('bird chirping' and 'key jingle') without tagging of other properties, thereby indicating that the sound issue is general, and not specific to an environment, duration and/or sensation.

According to some embodiments, the detection algorithm may take into account location factors, derived from a GPS. According to some embodiments, the location data may be taken into consideration automatically without being inputted in the user query. As a non-limiting example, a problem (e.g. difficulty understanding conversations) may be approached differently if the user is in a quiet place, in a noisy place, at the beach etc.

According to some embodiments, the detection algorithm may be interactive. For example, multiple options may be presented to the user, thereby walking the user through a designed decision-tree.

According to some embodiments, the issues identified and/or identifiable by the detection logic may be constantly updated to include new issues and/or properties as well as removing some. According to some embodiments, the updates may be made based on conversation trees made with the user and/or results of sessions made with a hearing professional.

According to some embodiments, if multiple issues match the user-initiated input, the user may be prompted to provide additional information, specifically a description of properties that will differentiate between the multiple matching issues, until only one issue matches, no issue matches, or multiple issues match with no possibility of differentiation via properties. In the latter case, multiple solutions may be presented to the user for selection with the textual description of the relevant issues.

According to some embodiments, once an issue that, according to the detection algorithm is related to the hearing deficiency is inputted by the user, the issue may be presented to the user for user confirmation. According to some embodiments, the presentation may be graphical and/or textual. A non-limiting example of a presentation of a potential issue may be a text message reading "we understand you experience bird sounds as painful, did we understand correctly?"

As used herein, the term "second user input" may refer to a user confirmation, decline or adjustment of the issue presented by the detection logic as being related to the deficiency in his/her hearing experience.

According to some embodiments, if the second user input is indicative of the suggested issue being irrelevant to the perceived deficiency in the user's hearing experience, a revised suggested issue may be provided by the detection algorithm. According to some embodiments, the revising of the issue may include presenting to the user follow-up questions. According to some embodiments, the revising of the issue may include presenting to the user a second issue identified by the detection logic as also being possibly related to the hearing deficiency reported by the user (e.g. we understand you experience high-pitched, shrill sounds as being painful, did we understand correctly?").

According to some embodiments, if the second user input is indicative of the suggested issue being only somewhat related to the deficiency, the user may be requested to rephrase the user-initiated input.

As used herein, the term "solution algorithm" refers to an AI algorithm configured to produce a solution to an identified (and confirmed) issue. Preferably the AI algorithm applied incorporates expert knowledge (that may, for example, be retrieved from relevant and acknowledged literature and/or professional audiologists) as well as subject related parameters, such as, but not limited to, the profile of the user (e.g. age, gender, medical history and the like), the user's audiogram (as obtained from a hearing test), current hearing aid parameter values, previous adjustments made to the hearing aid parameters, changes previously made by the user in a same acoustic environment, trends in changes of hearing aid parameters (e.g. due to a decrease in the subject's hearing ability), the user's acoustic fingerprint (e.g. preferences, specific disliked sounds, etc.) and any combination thereof. Each possibility is a separate embodiment. As used herein the term "artificial intelligence (AI) refers to the field of computer science which makes a computer system that can mimic human intelligence.

According to some embodiments, the detection algorithm and the solution algorithm may be two modules of the same algorithm/platform. According to some embodiments, the detection algorithm and the solution algorithm may be different algorithms applied sequentially through/by the platform.

According to some embodiments, the deficiency in the user's hearing experience may be related to sound level/volume, type of sound (speech, music, constant sounds), pitch of the sound, background noise, sound duration, sound sensation, or any combination thereof. Each possibility is a separate embodiment.

According to some embodiments, the deficiency in the user's hearing experience may be related to sound loudness, sound quality, interfering noises, perception of the user's own voice, acoustic feedback, technical problems, or any combination thereof. According to some embodiments, the deficiency in the user's hearing experience may be further subcategorized.

For example, under the category of sound loudness the user can define the type of sound he/she is having difficulty with, such as speech sounds, environmental sounds, phone conversation, TV, music or movie at the cinema, and under each subcategory the user can define the precise type of sound he/she is having difficulty with. For example, under the subcategory of speech sounds, the user will be asked to define whether it is a male/female voice, distant speech, whisper, etc. Similarly, under the category of distracting noises, the user may, for example, define the type of noise, such as traffic/street noise, wind noise, restaurant noise, crowd noise, etc. Under the category of acoustic feedback, the user may, for example, define the frequency and the situation in which the feedback occurs (while talking on the phone, listening to music, watching a movie, etc.).

According to some embodiments, the suggested solution may be a one-time solution, i.e. adjusting the one or more parameters in a single implementational step. According to some embodiments, the suggested solution may be interactive, i.e. the adjusting of the one or more parameters may, for example, be made in multiple steps while requesting feedback from the user. According to some embodiments, the suggested solution may include an "adjustment plan", namely a set of incremental changes to the one or more parameters, the incremental changes configured for being applied after initial implementation of the suggested solution.

According to some embodiments, the parameters that may be changed as part of the solution may be one or more parameters selected from: increasing gain for a specific channel, decreasing gain for a specific channel, replacing the dome (the ear piece) of the hearing aid, adding/changing a hearing program (such as a special program for music or for talking on the phone), replacing the battery, enabling/disabling specific features, such as directionality and noise reduction, or any combination thereof. Each possibility is a separate embodiment.

According to some embodiments, the solution may be implemented automatically, i.e. without requiring user authorization. According to some embodiments, the user may be requested to authorize implementation of the suggested solution. According to some embodiments, the authorization may be a one-time request whereafter, if approved, the solution is implemented. Alternatively, the authorization may include two or more steps. For example, the user may initially be requested to approve implementation of the solution for a limited amount of time, whereafter a request to authorize a more long-time authorization is provided, e.g. through the user-interface.

According to some embodiments, the method further includes a step of requesting the user's follow-up input (e.g. through the app) regarding the perceived efficacy of the solution after its implementation. According to some embodiments, the follow-up may be requested 1 minute after implementation of the solution, 5 minutes after implementation of the solution, 10 minutes after implementation of the solution, half an hour after implementation of the solution, one hour after implementation of the solution, 2 hours after implementation of the solution, 5 hours after implementation of the solution, 1 day after implementation of the solution, 2 days after implementation of the solution, 1 week after implementation of the solution, or any other time frame within the range of 1 minutes and 1 week after implementation of the solution. Each possibility is a separate embodiment.

According to some embodiments, the solution algorithm may be updated, based on the user's follow-up indication. According to some embodiments, the updating may include using machine learning modules on the implemented solutions. In this way the algorithm "learns" the user's individual preferences, thus advantageously improving the ability of the algorithm to provide solutions that, when implemented, will be found satisfactory by the user. According to some embodiments, the solution algorithm may be routinely updated based on solutions that proved to be efficient for other users.

According to some embodiments, implemented solutions, which were found by the user to improve his/her perceived hearing experience, may be stored (e.g. on the cloud associated with the app, in the user's hearing aid, or on the user's computer/mobile phone or using any other storage solution). According to some embodiments, the storing comprises categorizing and/or labeling of the solution. As a non-limiting example, the solution may be categorized into permanent solutions and temporary solutions. As another non-limiting example, the solution may be labeled according to its type, e.g. as periodical solutions, location specific solutions, activity-specific solutions, sound environment solutions, etc. Each possibility is a separate embodiment. It is understood that in some instances a solution may receive more than one label, e.g. being both a periodic solution (e.g. every Tuesday) and associated with an activity (e.g. meeting with a group of friends).

According to some embodiments, the implementation of the solution may be permanent. According to some embodiments, the implementation may be temporary.

According to some embodiments, the implementation of the solution may be time limited e.g. for a certain amount of time (e.g. the next 2 hours). According to some embodiments, the implementation of the solution may be periodical (e.g. every morning). According to some embodiments, the implementation of the solution may be limited to a certain location, for example based on GPS coordinates, such that every time the user goes to a certain place, e.g. his/her local coffee shop, the solution may be implemented or the user may be prompted to implement the solution. According to some embodiments, the implementation of the solution may be limited to a certain activity (e.g. every time the user listens to music or goes to a lecture). According to some embodiments, the implementation of the solution may be limited to a certain sound environment. For example, the user may be prompted to apply a previously successfully implemented solution, when entering a similar sound environment. According to some embodiments, the platform and/or the hearing aid may be provided with a number of ready-to-be-applied pre-stored programs. According to some embodiments, the solution may be applied or prompted for application for a specific pre-stored program only.

According to some embodiments, if the solution to the perceived deficiency in the user's hearing experience is indicated to be only partially solved, the user may be requested to provide a second follow-input. For example, the user may be asked whether the solution should be reimplemented, e.g. if the gain of a specific channel was raised, the reapplying of the solution may be to further raise the gain of that channel. As another example, the user may be asked to re-phrase the problem in order to provide an alternative and/or complementing solution.

According to some embodiments, if the solution does not solve the perceived deficiency in the user's hearing experience, the user may be requested to rephrase the problem encountered. Additionally or alternatively, a remote session with a hearing professional (audiologist) may be suggested. According to some embodiments, once remote access is established, the hearing professional may change the settings/parameters of the hearing aid. According to some embodiments, the solution algorithm may be updated based on added data parameter changes and the like, made by the hearing professional after the remote session was completed.

According to some embodiments, changes made to the one or more parameters by the hearing professional and which changes are indicated by the user to improve the perceived hearing deficiency may be stored and optionally labelled (e.g. as hearing professional adjustments).

According to some embodiments, the method/platform may further store a list of parameter versions. According to some embodiments, the method/platform may include an option of presenting to the user a version-history list of changes made to his/her hearing aid. According to some embodiments, the user may revert to a specific version, e.g. by clicking thereon.

According to some embodiments, the changes (successful and unsuccessful) made to the one or more parameters, whether through the applying of the herein disclosed solution algorithm or by the hearing professional, may be "learned" by the machine learning module of the solution algorithm, thereby improving the ability of the algorithm to provide solutions that, when implemented, will be found satisfactory by the user.

Reference is now made to FIG. 1, which is a flow chart 100 of the herein disclosed method for personalized hearing aid adjustment.

In step 110 of the method, the user provides a user-initiated input (e.g. through an app installed on his/her phone, the app functionally connected to the hearing aid), due to a perceived deficiency in his/her hearing experience. As a non-limited example, the user may find that the sounds of the cutlery made during a dinner, superseded the speech of the people with whom the user dines. As further elaborated herein, the user-initiated input may be provided as a textual message or by choosing an input from a scroll-down menu.

Next, in step 120, a detection algorithm is applied on the user-initiated input to identify the issue (at times out of multiple potential issues), as essentially described herein. For example, for the above recited user-initiated input, the detection algorithm may suggest that the issue is that 'metallic sounds sound louder than speech'. The issue is then presented to the user, e.g. via the app, in step 130.

If the issue presented to the user is found to be irrelevant or insufficiently describes the issue, the detection algorithm may be reapplied until an issue is agreed upon; or if no agreement is reached, a remote session with a hearing professional may be suggested (step 140*b*).

If the issue identified by the detection algorithm is found to be relevant by the user, a solution algorithm may be applied to provide a suggested solution to the perceived deficiency, typically in the form of an adjustment of one or more parameters of the hearing aid (step 140*a*), as essentially described herein. According to some embodiments, the identified proposed solution may be automatically applied. Alternatively, a request may be sent to the user to authorize the implementation of the solution (step not shown).

Optionally, after implementation of the solution, the user may, via the app, be requested to provide a follow-up input regarding the efficiency of the implemented solution.

If the implemented solution is found by the user to insufficiently solve the hearing deficiency reported, the solution algorithm may be reapplied until a satisfying solution is obtained; or if no solution is satisfactory, a remote session with a hearing professional may be suggested (step 150*a*).

If the implemented solution is found to be satisfactory by the user, the solution may be stored, permanently implemented or implemented or suggested to for implementation at a specific time, in specific locations, during specific activities, in certain sound environments or the like, or any combination thereof, as essentially described herein (step 150*b*). Each possibility is a separate embodiment.

Optionally, the method may include an additional step 160 of updating the solution algorithm, based on the implemented solutions (whether satisfactory or unsatisfactory) as well as any changes made by a hearing professional during a remote session, to obtain an updated solution algorithm further personalized to fit the specific user's requirement and/or preferences.

Figure 2:
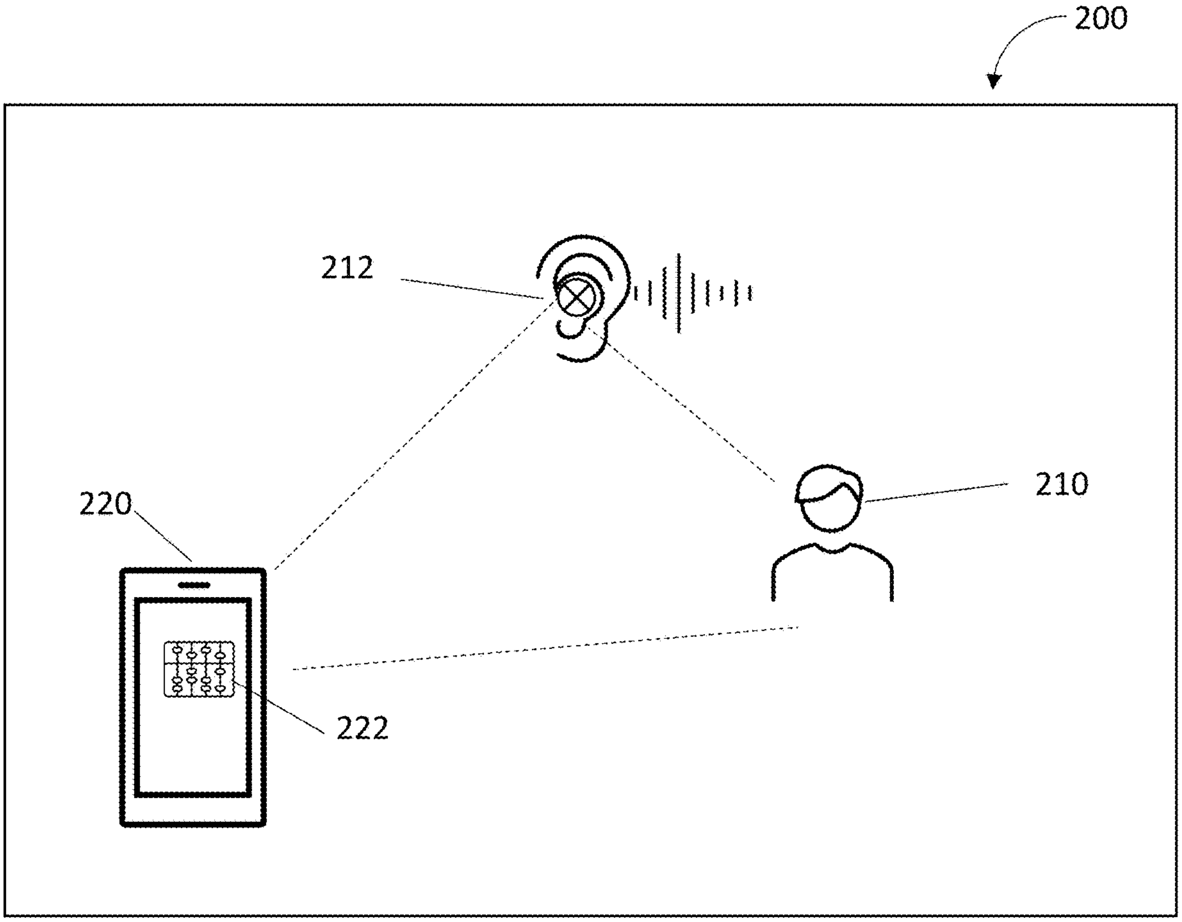
FIG. 2 schematically illustrates a system for personalized hearing aid adjustment, according to some embodiments.

Reference is now made to FIG. 2, which is a schematic illustration of a system 200 for personalized hearing aid adjustment, according to some embodiments. System 200 includes a hearing aid 212 of a user 210, at least one hardware processor, here the user's mobile phone 220 including a non-transitory computer-readable storage medium having stored thereon program code, the program code executable by the hardware processor, here mobile app 222 configured to execute the method as essentially outlined in flowchart 100, while receiving input and/or instructions (such as a user-initiated input, an authorization to implement a solution, and the like).

According to some embodiments, system 200 may be further configured to enable simple Q&A regarding the operation of hearing aid 212 via app 222, such as questions and answers (Q&A) regarding battery change, regarding turning and off the device, etc.

Reference is now made to FIG. 3-FIG. 7, which show optional implementations of system 200 and the method set forth in FIG. 1 and as disclosed herein. It is understood by one of ordinary skill in the art that the examples are illustrative only and that many other hearing aid or hearing experience related deficiencies may be handled using the herein disclosed system and method. It is also understood that the phrasing chosen for the figures is exemplary in nature.

Figure 3:
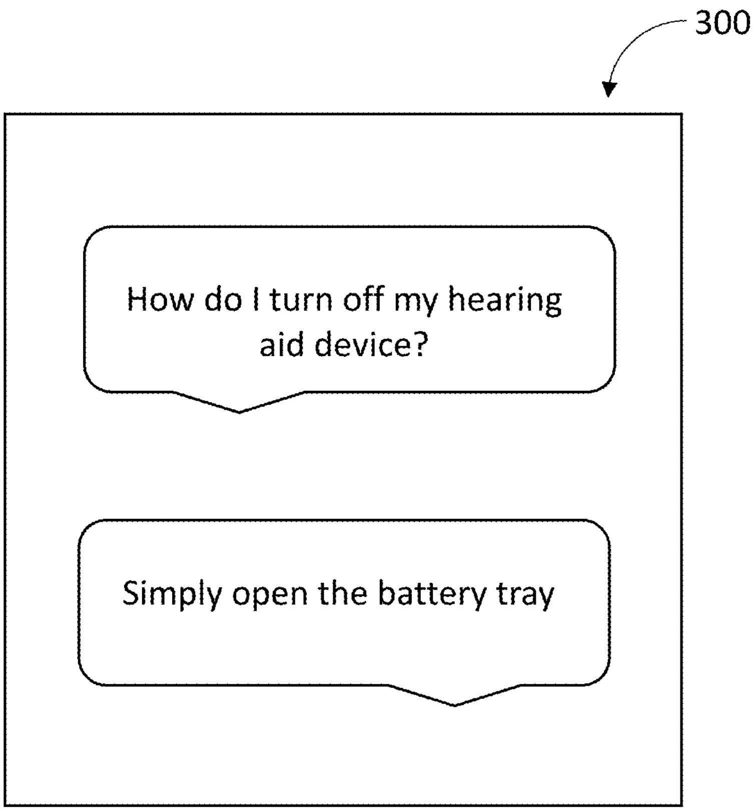
FIG. 3 depicts an exemplary Q&A operation of the herein disclosed system, according to some embodiments.

FIG. 3 shows an optional Q&A operation 300 of system 200. Here the user, such as user 210, provides a user-initiated input in the form of a text message delivered through a chat bot. In this case the user requests to know 'How to turn off my hearing aid device?'. In some instances, when the user-input is a simple question, unrelated to hearing experience, deriving of the issue from the text message and/or confirmation of the relevancy of the issue may not be required. Instead, as in this case, the answer may be directly posed stated: 'Simply open the battery tray'.

Figure 4:
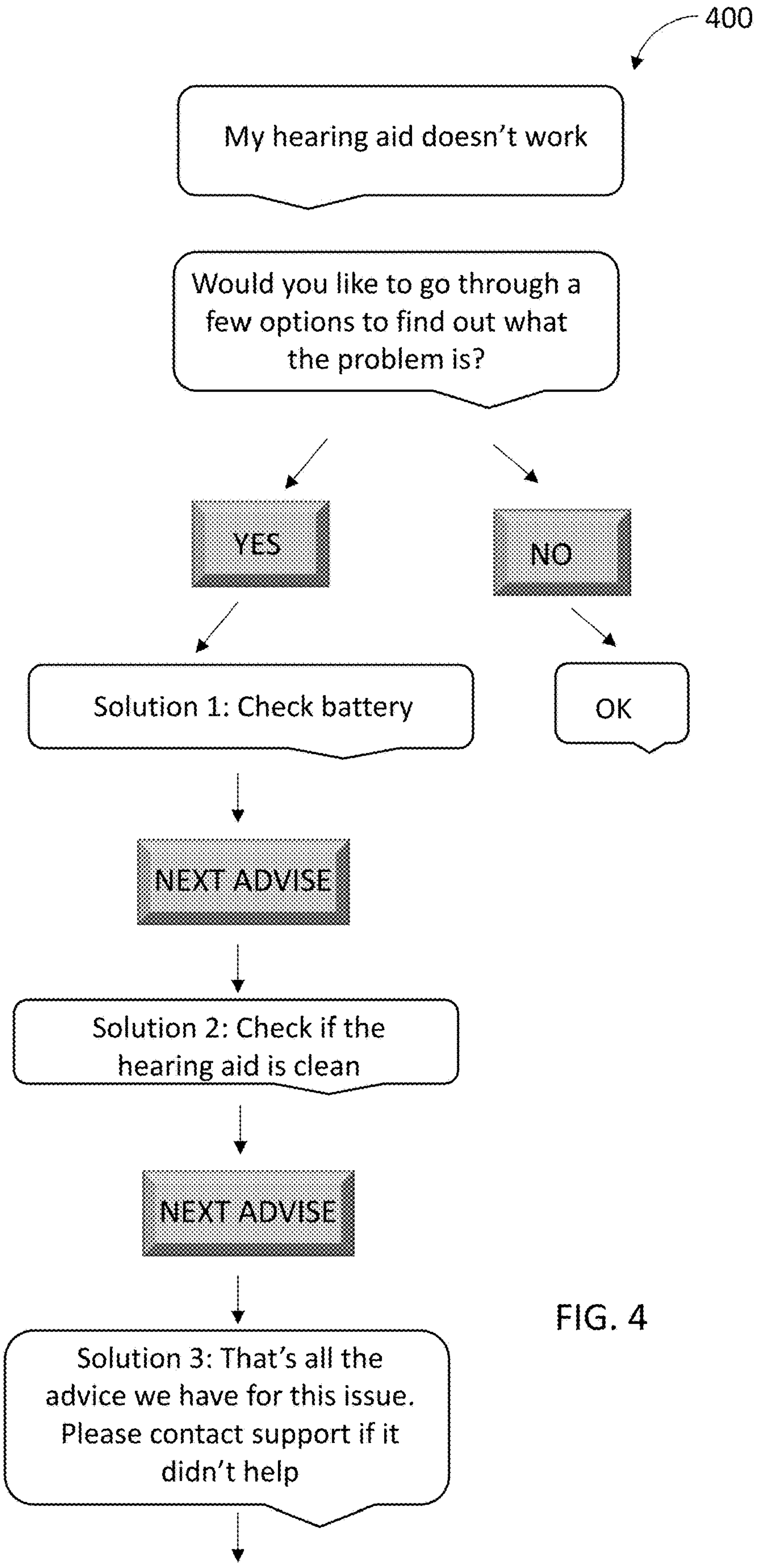
FIG. 4 depicts an exemplary, simple conversation tree conducted using the herein disclosed system and method. In this instance the conversation tree is related to the operation of the hearing aid.

Reference is now made to FIG. 4 which shows an illustrative example of a relatively simple conversation tree 400, that may be conducted using system 200. In this instance the conversation tree is not related to a hearing experience of the user, but rather to the operation of the hearing aid, namely 'My hearing aid does not work'. Here more than one solution may be relevant to the solving of the issue, and the user may be guided through a decision tree presenting the solutions, preferably in an order from most likely solution to least likely solution, until the user reports the issue as solved.

Figure 5:
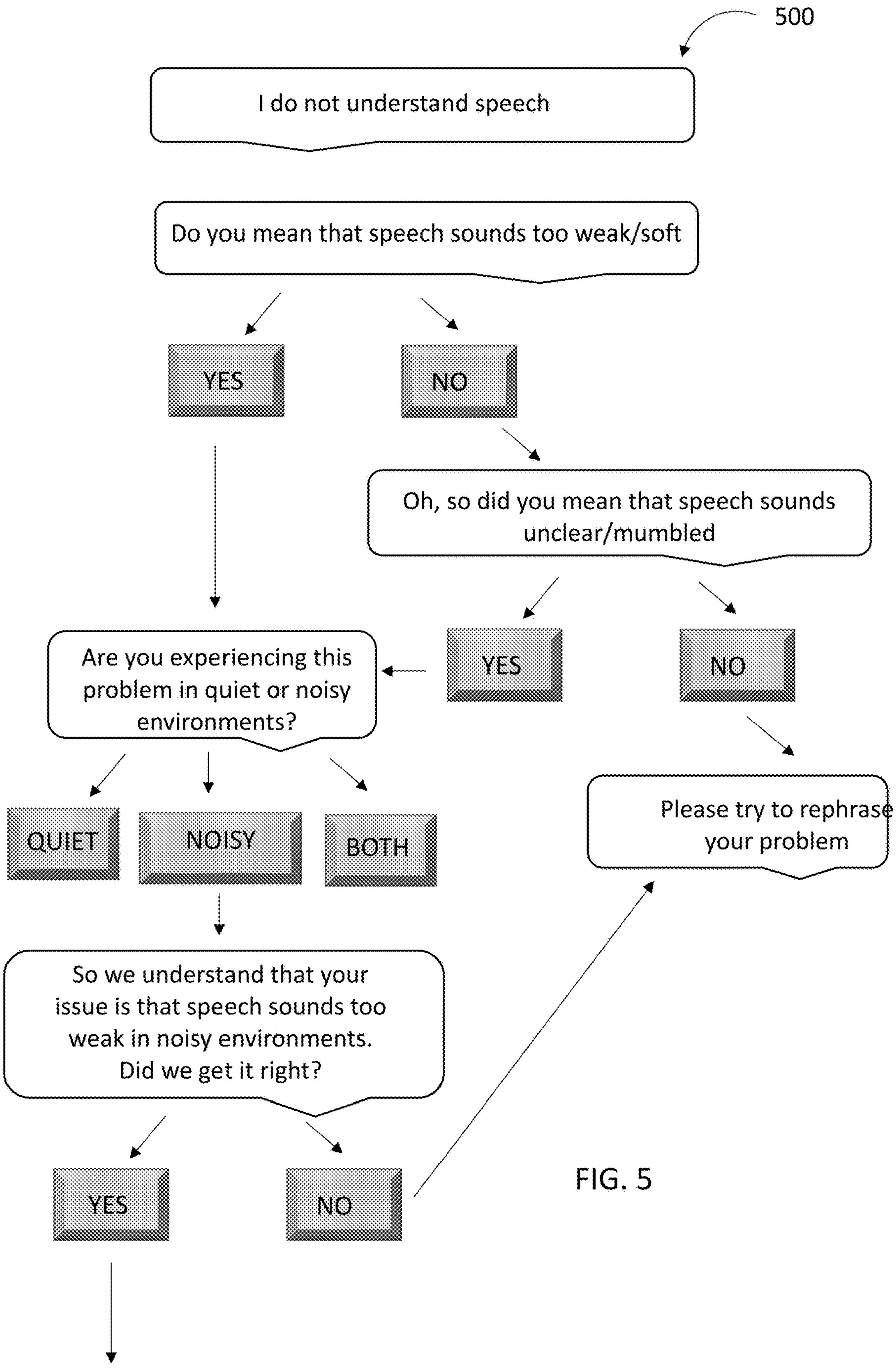
FIG. 5 depicts an exemplary, complex conversation tree conducted using the herein disclosed system and method. In this instance the conversation tree is related to a deficiency in the user's hearing experience.
Figure 5:
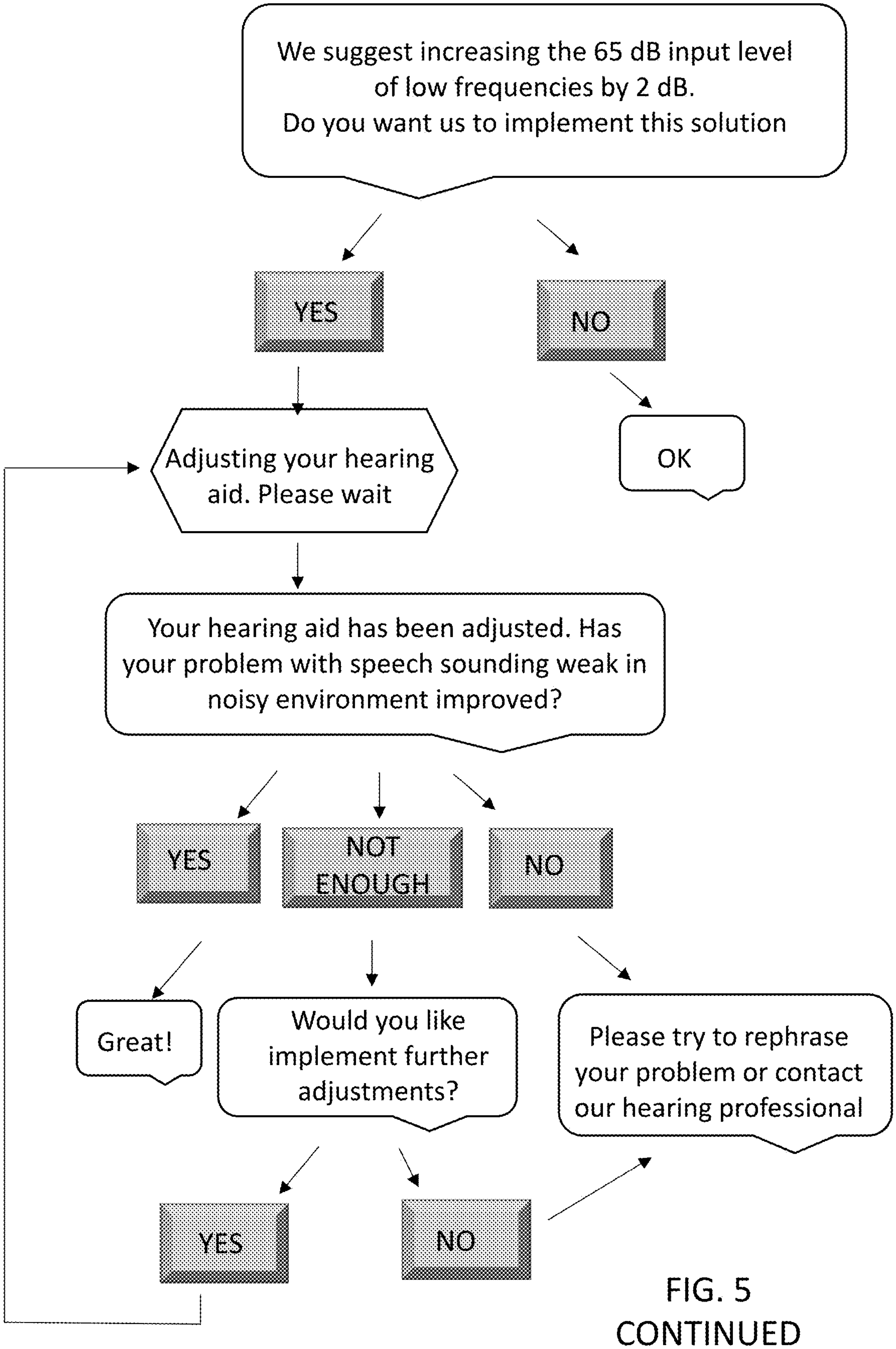

Reference is now made to FIG. 5 which shows an illustrative example of a complex conversation tree 500, that may be conducted using system 200. In this instance the conversation tree is related to a hearing experience of the user (here speech sounding too weak).

As seen from conversation tree 500, detecting the issue related to the hearing deficiency reported by the user, using the detection algorithm (as described herein) may be a multistep process with several 'back-and-forth' s with the user.

It is further understood that once a satisfying solution has been implemented the solution may be stored.

Figure 6:
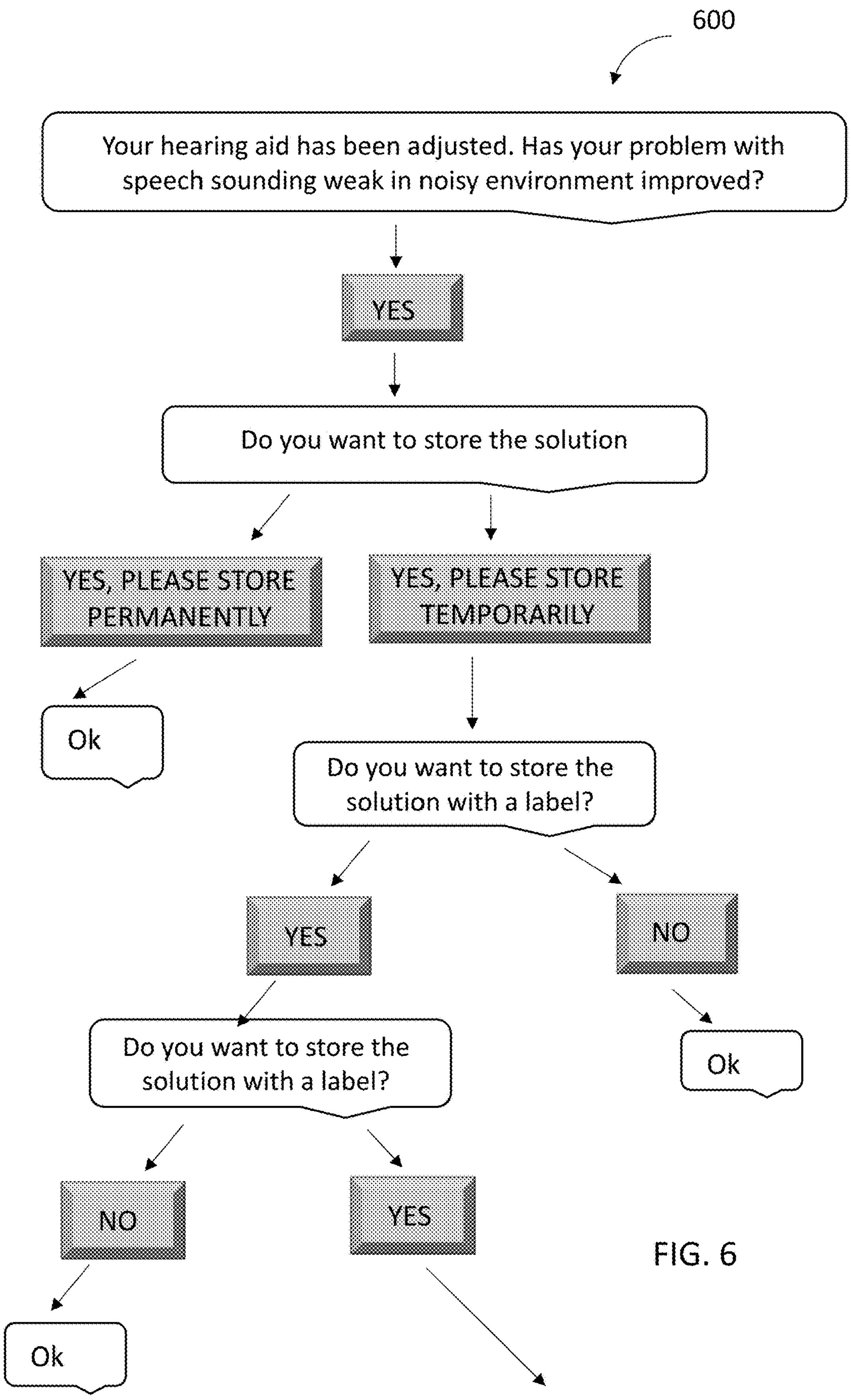
FIG. 6 depicts a conversation tree related to the storing and labeling of an implemented solution to a hearing deficiency reported by the user, using the herein disclosed system and method.
Figure 6:
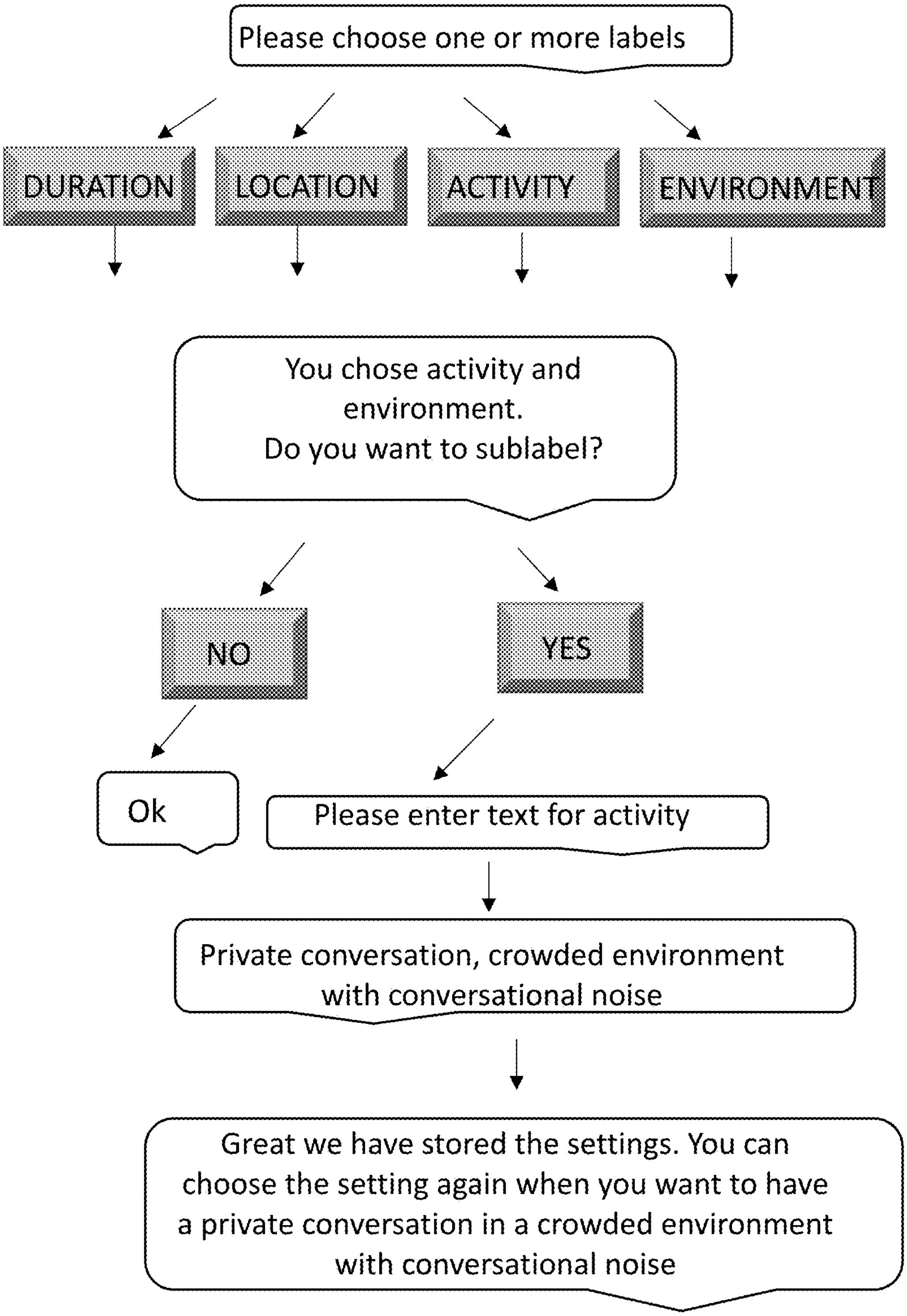

Optionally, the chat-bot may continue, as for example set forth in FIG. 6, in order to store and/or label the settings for future use. It is understood that the specific outlay of the storing and labeling may be different. For example, the initial labeling may be obviated and the user my directly label the settings as per his/her preferences. It is further understood that the stored settings may be utilized only per the user's request. Alternatively, the app may prompt the user to apply the setting, for example, when a GPS location is indicative of the user entering a same location, conducting a same activity (e.g. upon arriving at a concert hall) or the like.

It is also understood that the detection and/or solution algorithms may be updated once the problem has been resolved in order to further personalize the algorithms to the user's needs and preferences, as essentially described herein.

Figure 7:
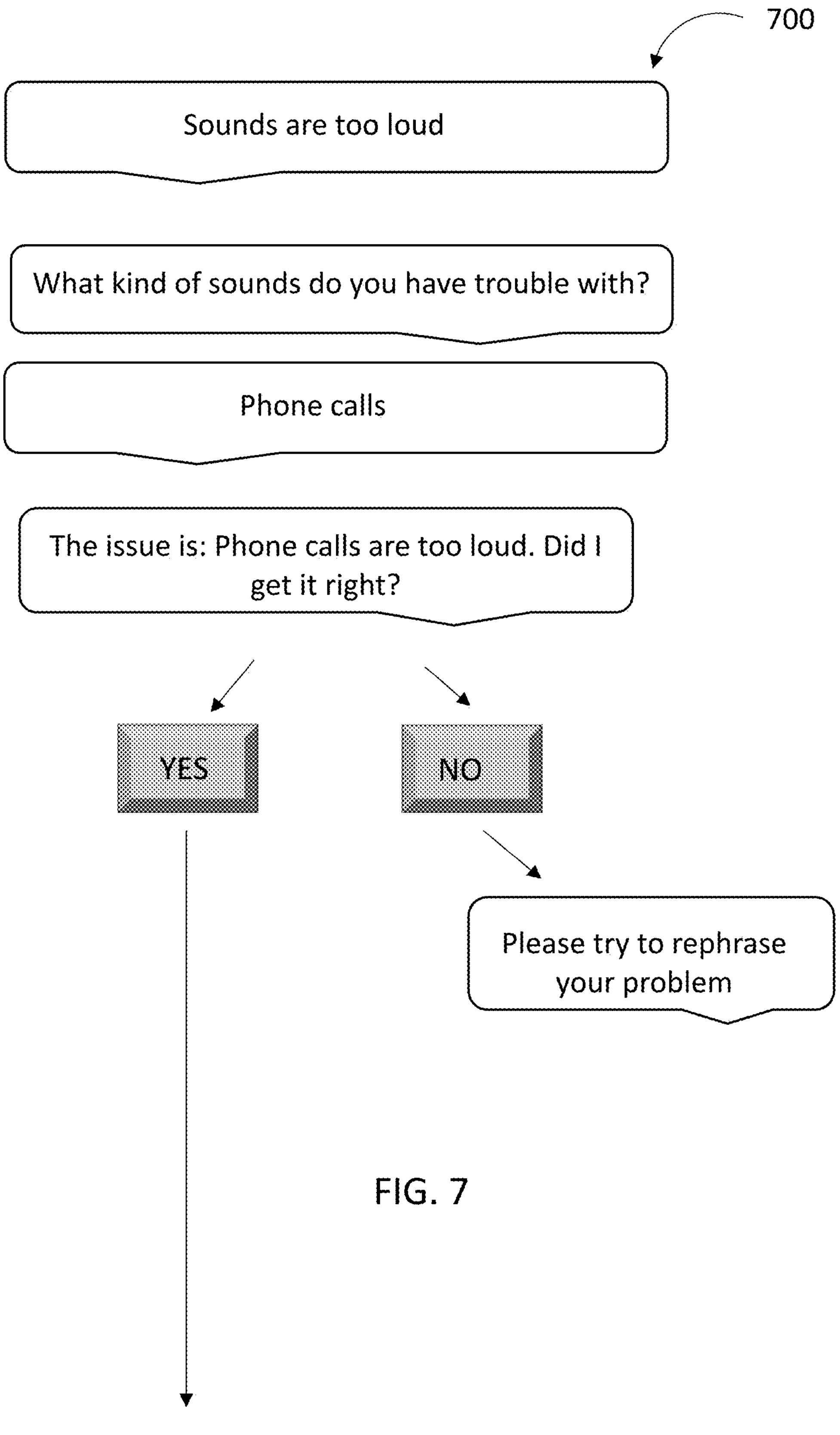
FIG. 7 depicts an exemplary, complex conversation tree conducted using the herein disclosed system and method. In this instance the conversation tree is related to a deficiency in the user's hearing experience.
Figure 7:
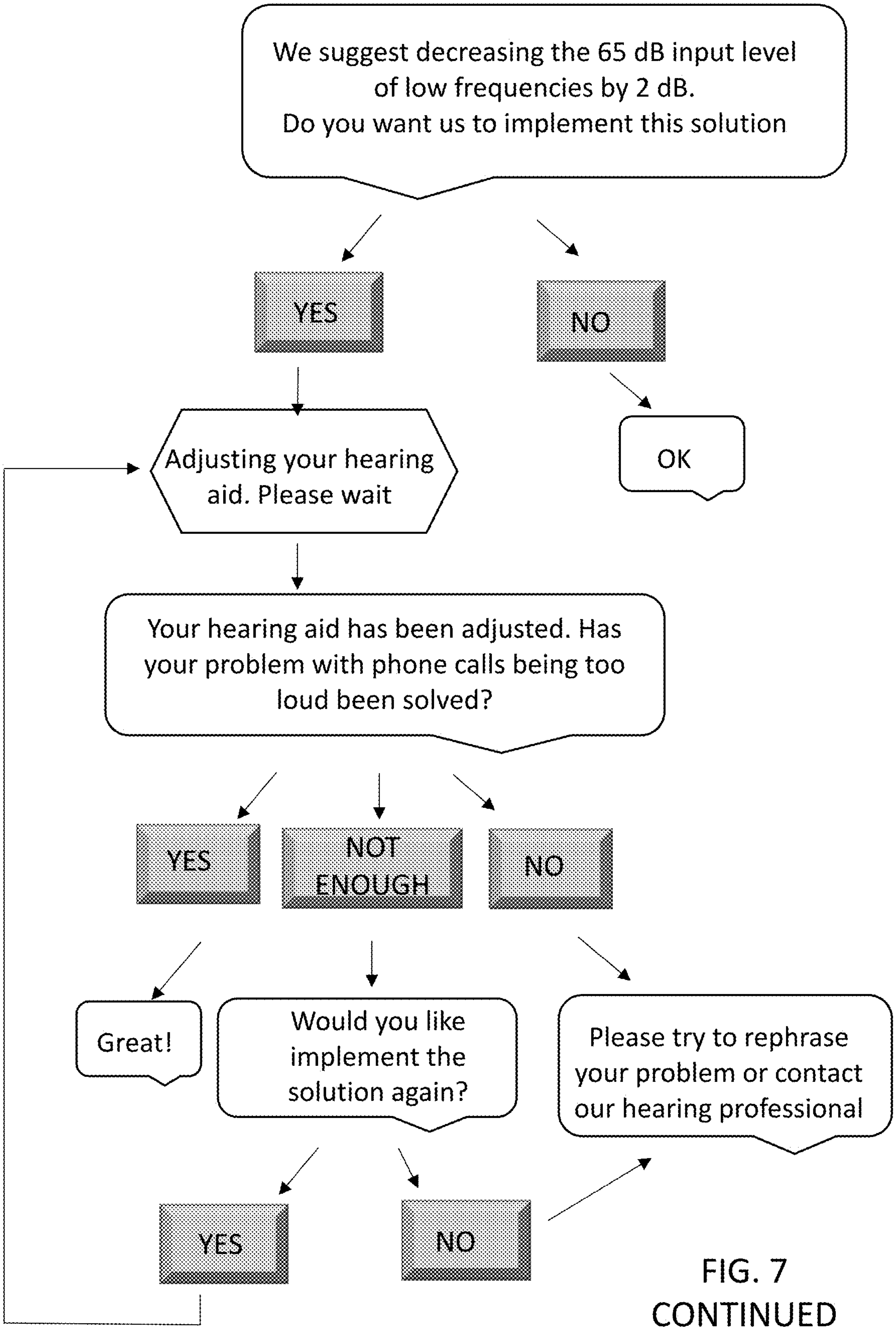

Reference is now made to FIG. 7, which shows an illustrative example of a complex conversation tree 700, that may be conducted using system 200. In this instance the conversation tree is related to a hearing experience of the user (here phone call sounds being too loud).

As seen from conversation tree 700, detecting the issue related to the hearing deficiency reported by the user, using the detection algorithm, (as described herein) may be a multistep process with several 'back-and-forth' s with the user.

Unless otherwise defined the various embodiment of the present invention may be provided to an end user in a plurality of formats and platforms, and may be outputted to at least one of a computer readable memory, a computer display device, a printout, a computer on a network, a tablet or a smartphone application or a user. Unless otherwise defined, all technical and scientific terms used herein have the same meaning as commonly understood by one of ordinary skill in the art to which this invention belongs. The materials, methods, and examples provided herein are illustrative only and not intended to be limiting.

Implementation of the method and system of the present invention involves performing or completing certain selected tasks or steps manually, automatically, or a combination thereof. Moreover, according to actual instrumentation and equipment of preferred embodiments of the method and system of the present invention, several selected steps could be implemented by hardware or by software on any operating system of any firmware, or a combination thereof. For example, as hardware, selected steps of the invention could be implemented as a chip or a circuit. As software (or program code), selected steps of the invention could be implemented as a plurality of software instructions being executed by a computer using any suitable operating system. In any case, selected steps of the method and system of the invention could be described as being performed by a data processor, such as a computing platform for executing a plurality of instructions.

Although the present invention is described with regard to a "processor" "hardware processor" or "computer" on a "computer network", it should be noted that optionally any device featuring a data processor and/or the ability to execute one or more instructions may be described as a computer, including, but not limited to, a PC (personal computer), a server, a minicomputer, a cellular telephone, a smart phone, a PDA (personal data assistant), or a pager. Any two or more of such devices in communication with each other, and/or any computer in communication with any other computer, may optionally comprise a "computer network".

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

The invention may be described in the general context of computer-executable instructions, such as program modules, being executed by a computer. Generally, program modules include routines, programs, objects, components, data structures, and so forth, which perform particular tasks or implement particular abstract data types. The invention may also be practiced in distributed computing environments where tasks are performed by remote processing devices that are linked through a communications network. In a distributed computing environment, program modules may be located in both local and remote computer storage media, including memory storage devices.

In the description and claims of the application, the words "include" and "have", and forms thereof, are not limited to members in a list with which the words may be associated.

Unless otherwise defined, all technical and scientific terms used herein have the same meaning as commonly understood by one of ordinary skill in the art to which this disclosure pertains. In case of conflict, the patent specification, including definitions, governs. As used herein, the indefinite articles "a" and "an" mean "at least one" or "one or more" unless the context clearly dictates otherwise.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. No feature described in the context of an embodiment is to be considered an essential feature of that embodiment, unless explicitly specified as such.

Although stages of methods according to some embodiments may be described in a specific sequence, methods of the disclosure may include some or all of the described stages carried out in a different order. A method of the disclosure may include a few of the stages described or all of the stages described. No particular stage in a disclosed method is to be considered an essential stage of that method, unless explicitly specified as such.

Although the disclosure is described in conjunction with specific embodiments thereof, it is evident that numerous alternatives, modifications and variations that are apparent to those skilled in the art may exist. Accordingly, the disclosure embraces all such alternatives, modifications and variations that fall within the scope of the appended claims. It is to be understood that the disclosure is not necessarily limited in its application to the details of construction and the arrangement of the components and/or methods set forth herein. Other embodiments may be practiced, and an embodiment may be carried out in various ways.

The phraseology and terminology employed herein are for descriptive purpose and should not be regarded as limiting. Citation or identification of any reference in this application shall not be construed as an admission that such reference is available as prior art to the disclosure. Section headings are used herein to ease understanding of the specification and should not be construed as necessarily limiting.

While certain embodiments of the invention have been illustrated and described, it will be clear that the invention is not limited to the embodiments described herein. Numerous modifications, changes, variations, substitutions and equivalents will be apparent to those skilled in the art without departing from the spirit and scope of the present invention as described by the claims, which follow.

The invention claimed is:

1. A method of personalized hearing aid adjustment, the method comprising:

receiving a user-initiated input regarding a perceived deficiency in the user's hearing experience, the deficiency related to the hearing aid, providing to the user, using a detection algorithm, a suggestion regarding an issue potentially related to the perceived deficiency in the user's hearing experience, receiving from the user a second user input regarding the relevancy of the suggested issue;

wherein when the second user input is indicative of the suggested issue being irrelevant to the perceived deficiency in the user's hearing experience, a revised suggested issue is provided using the detection algorithm, and wherein when the second user input is indicative of the suggested issue being relevant to the perceived deficiency in the user's hearing experience, provide a suggested solution to the perceived deficiency utilizing a solution algorithm, wherein the suggested solution comprises adjusting one or more parameters of the hearing aid.

2. The method of claim 1, wherein the deficiency in the user's hearing experience is selected from sound loudness, sound quality, interfering noises, perception of the user's own voice, acoustic feedback, technical problems, or any combination thereof.

3. The method of claim 1, wherein the one or more parameters is selected from increasing gain for a specific channel, decreasing gain for a specific channel, replacing the dome of the hearing aid, adding/changing a hearing program, replacing the battery, and enabling/disabling specific features, or any combination thereof.

4. The method of claim 1, wherein the user-initiated input is a textual description and wherein the detection algorithm is configured to derive the issue from the textual description.

5. The method of claim 4, wherein deriving the issue from the textual description comprises identifying key elements indicative of the issue in the textual description.

6. The method of claim 1, wherein the solution algorithm is an artificial intelligence algorithm taking into consideration expert knowledge, user profile, the user's audiogram, current hearing aid parameter values, previous adjustments made to the hearing aid parameters, changes previously made by the user in a same environment, trend in changes of hearing aid parameters, the user's acoustic fingerprint, and any combination thereof.

7. The method of claim 1, further comprising requesting authorization from the user to implement the suggested solution.

8. The method of claim 1, further comprising providing instructions to the user regarding the implementation of the suggested solution.

9. The method of claim 1, further comprising requesting the user's follow-up input regarding the perceived efficacy of the suggested solution after its implementation.

10. The method of claim 9, further comprising updating the solution algorithm based on the user's follow-up indication.

11. The method of claim 1, wherein the suggested solution comprises a set of incremental changes to the one or more parameters, the incremental changes configured for being applied gradually after initial implementation of the suggested solution.

12. The method of claim 1, further comprising generating one or more sound environment categories, each category comprising a solution previously implemented for the user in association with the sound environments.

13. The method of claim 1, further comprising prompting the user to apply a previous implemented solution when entering a similar sound environment.

14. The method of claim 13, wherein the prompting to apply a previous implemented solution is based on a temporal or spatial prediction.

15. A system for personalized hearing aid adjustment, the system comprising a processing logic configured to:

receive a user-initiated input regarding a perceived deficiency in the user's hearing experience, the deficiency related to the hearing aid, apply a detection algorithm on the user-initiated input, the detection algorithm configured to derive an issue potentially related to the perceived deficiency in the user's hearing experience from the user-initiated input, and upon receiving a user confirmation of the issue being relevant to the perceived deficiency in the user's hearing experience, provide a suggested solution to the perceived deficiency utilizing a solution algorithm, wherein the suggested solution comprises a proposed adjustment of one or more parameters of the hearing aid.

16. The system of claim 15, wherein the processing logic is further configured to provide a revised suggested issue, if the suggested solution is indicated by the user as being irrelevant to the suggested issue.

17. The system of claim 15, wherein the one or more parameters is selected from increasing gain for a specific channel, decreasing gain for a specific channel, replacing the dome of the hearing aid, adding/changing a hearing program, replacing the battery, and enabling/disabling specific features, or any combination thereof.

18. The system of claim 15, wherein the user-initiated input is a textual description and wherein the detection algorithm applied by the processing logic is configured to derive the issue from the textual description.

19. The system of claim 15, wherein the solution algorithm is an artificial intelligence algorithm taking into consideration expert knowledge, user profile, the user's audiogram, current hearing aid parameter values, previous adjustments made to the hearing aid parameters, changes previously made by the user in a same environment, trend in changes of hearing aid parameters, the user's acoustic fingerprint, and any combination thereof.

20. The system of claim 15, wherein the processing logic is further configured to request a follow-up input from the user, the follow-up input indicative of the user's perceived efficacy of the suggested solution after its implementation.

21. The system of claim 20, wherein the processing logic is further configured to update the solution algorithm based on the user's follow-up indication.

22. The system of claim 15, further comprising a hearing aid operationally connected to the processing logic.

23. The system of claim 15, wherein the processing logic is configured to be executable on a smartphone, an iPAD, a laptop or a personal computer of the user.

24. The system of claim 15, wherein the control processing is further configured to store a successfully implemented solution, wherein the successful solution implemented is a suggested solution which received a follow-up input from the user indicative of it being efficient in improving the perceived deficiency in the user's hearing experience after being implemented.

25. The system of claim 24, wherein the processing logic is further configured to generate one or more sound environment categories, and wherein the storing comprises storing the suggested solutions in an appropriate category, the appropriate category being associated with a sound environment in which the suggested solution was successfully implemented.

* * * * *